(12) United States Patent  
Masuno

(10) Patent No.: US 12,494,402 B2  
(45) Date of Patent: Dec. 9, 2025

(54) SEMICONDUCTOR DEVICE

(71) Applicant: Murata Manufacturing Co., Ltd., Kyoto-fu (JP)

(72) Inventor: Shinya Masuno, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 395 days.

(21) Appl. No.: 18/349,685

(22) Filed: Jul. 10, 2023

(65) Prior Publication Data

US 2024/0014084 A1   Jan. 11, 2024

(30) Foreign Application Priority Data

Jul. 11, 2022   (JP) .................................. 2022-111157

(51) Int. Cl.
*H01L 23/29* (2006.01)
*H01L 23/522* (2006.01)

(52) U.S. Cl.
CPC ........ *H01L 23/295* (2013.01); *H01L 23/5226* (2013.01)

(58) Field of Classification Search
CPC ........................... H01L 23/295; H01L 23/5226

USPC ........................................................ 257/713
See application file for complete search history.

(56) References Cited

U.S. PATENT DOCUMENTS 9,214,337 B2   12/2015   Carroll et al.
10,079,160 B1 *  9/2018   Margomenos .......... H01L 23/10

* cited by examiner

*Primary Examiner* — Tu-Tu V Ho
(74) *Attorney, Agent, or Firm* — Studebaker Brackett PLLC

(57) ABSTRACT

A device layer contains a semiconductor element in part of a region thereof. An insulating layer is on one surface of the device layer. A support substrate including a semiconductor is on a surface of the insulating layer on an opposite side from a side where the device layer is disposed. The support substrate has an opening overlapping a semiconductor element region in which the semiconductor element is formed in plan view and extending from a bottom surface of the support substrate to the insulating layer, the bottom surface being on an opposite side from a side where the insulating layer is disposed. An insulating heat dissipation layer contacts the insulating layer in a region encompassed by the opening in plan view and has a thermal conductivity higher than that of the insulating layer.

10 Claims, 7 Drawing Sheets

SEMICONDUCTOR DEVICE

CROSS-REFERENCE TO RELATED APPLICATION

This application claims benefit of priority to Japanese Patent Application No. 2022-111157, filed Jul. 11, 2022, the entire content of which is incorporated herein by reference.

BACKGROUND

Technical Field

The present disclosure relates to a semiconductor device.

Background Art

In semiconductor devices in which a radio-frequency circuit is formed on an SOI substrate, in which an insulating layer and a semiconductor layer are stacked on a support substrate composed of silicon (Si), harmonic distortion may occur due to a parasitic capacitance between the semiconductor layer and the support substrate. A semiconductor device structured so as to suppress the occurrence of harmonic distortion is disclosed in the specification of U.S. Pat. No. 9,214,337. In this semiconductor device, an opening is formed in a support substrate, the opening overlapping a region where a radio-frequency circuit is disposed in plan view. An insulating polymer is applied inside the opening and on the surface of the support substrate. Due to the removal of the part of the support substrate composed of Si located in the vicinity of the radio-frequency circuit, a parasitic capacitance between the radio-frequency circuit and the support substrate is reduced and harmonic distortion is suppressed.

In a configuration in which an opening is not formed in the support substrate composed of Si, heat generated by transistors included in a radio-frequency circuit is conducted to the support substrate, and as a result, an increase in the temperature of the transistors is suppressed. In a configuration in which an opening is formed in the support substrate, heat generated by the transistors is conducted to the polymer inside the opening and from the polymer to the support substrate. Since the surface of the support substrate is coated with the polymer, heat conducted to the support substrate passes through the polymer and is radiated into the surrounding space.

Since the thermal conductivity of the polymer is generally lower than that of the support substrate, when an opening is formed in the support substrate, the efficiency with which heat is dissipated from the transistors is lower than that in a configuration where no opening is formed in the support substrate. Therefore, the temperature of the transistors will tend to rise during operation of the radio-frequency circuit. Accordingly, the present disclosure provides a semiconductor device that can suppress an increase in a parasitic capacitance generated by a radio-frequency circuit including transistors and suppress an increase in the temperature of semiconductor elements such as transistors.

SUMMARY

An aspect of the present disclosure provides a semiconductor device including a device layer including a semiconductor element in part of a region thereof; an insulating layer disposed on one surface of the device layer; and a support substrate composed of a semiconductor and disposed on a surface of the insulating layer located on an opposite side from a side where the device layer is disposed.

An opening is provided in the support substrate, the opening overlapping a semiconductor element region in which the semiconductor element is formed in plan view and the opening extending from a bottom surface of the support substrate to the insulating layer, the bottom surface being located on an opposite side from a side where the insulating layer is disposed.

The semiconductor device further includes a heat dissipation layer that contacts the insulating layer in a region encompassed by the opening in plan view and has a thermal conductivity higher than a thermal conductivity of the insulating layer.

At least part of a region consisting of the bottom surface of the support substrate and a side surface of the opening is not covered by the heat dissipation layer.

An opening is provided that overlaps the semiconductor element region in plan view and a heat dissipation layer that contacts the insulating layer in a region encompassed by the opening has an insulating property, and therefore a parasitic capacitance generated in the semiconductor element region can be reduced. Heat generated in the semiconductor element region passes through the insulating layer and the heat dissipation layer and is radiated from the surface of the heat dissipation layer, and heat conducted to the support substrate is radiated from a surface of the support substrate. Since at least part of a region consisting of the bottom surface of the support substrate and the side surface of the opening is not covered by the heat dissipation layer, high efficiency of heat dissipation from the surface of the support substrate can be maintained. Thus, an increase in the temperature of the semiconductor element region can be suppressed.

DETAILED DESCRIPTION

First Embodiment

A semiconductor device according to a First Embodiment will be described while referring to FIGS. 1 to 7.

Figure 1:
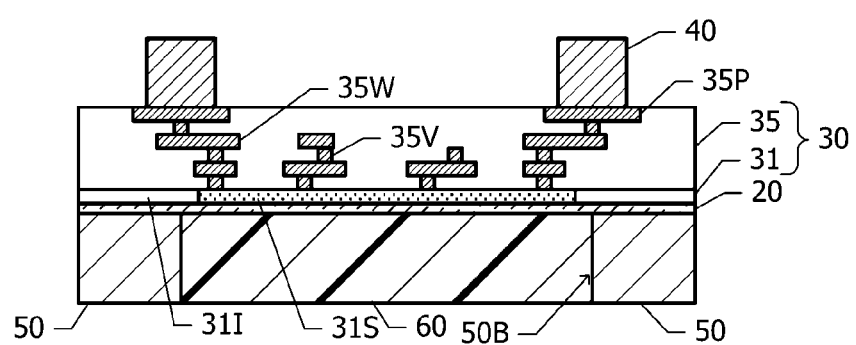
FIG. 1 is a sectional view of a semiconductor device according to a First Embodiment.

FIG. 1 is a sectional view of the semiconductor device according to the First Embodiment. The semiconductor device according to the First Embodiment includes a device layer 30, an insulating layer 20, a support substrate 50, a plurality of bumps 40, and a heat dissipation layer 60. The device layer 30 is disposed on one surface of the insulating layer 20 and the support substrate 50 is disposed on the other surface of the insulating layer 20. The plurality of bumps 40 protrude from the surface of the device layer 30 on the opposite side from the surface of the device layer 30 on which the insulating layer 20 is disposed. A direction from the support substrate 50 toward the device layer 30 is defined as an upward direction. The insulating layer 20 may have a single-layer structure or a multilayer structure. For example, when the insulating layer 20 has a single-layer structure, a silicon oxide layer may be used as the insulating layer 20. When the insulating layer 20 has a multilayer structure, the insulating layer 20 may be structured to include two layers, namely, a silicon oxide layer and a silicon nitride layer.

In FIG. 1, the ratios of the heights and in-plane dimensions of the individual components do not represent the ratios of the dimensions of the individual components in the actual semiconductor device. For example, in FIG. 1, the height dimension (thickness) of the device layer 30 is illustrated as being larger than the height of the bumps 40, but in reality, the thickness of the device layer 30 would be less than or equal to 100 nm and the height of the bumps 40 would be around 160 μm. The height dimension of the support substrate 50 is around 100 μm.

The device layer 30 includes an element formation layer 31 and a multilayer wiring layer 35 disposed on the element formation layer 31. The element formation layer 31 includes an insulating element isolation region 31I and a plurality of semiconductor element regions 31S (active regions) surrounded by the element isolation region 31I. A semiconductor element such as a MOS transistor is formed in each of the semiconductor element regions 31S. The semiconductor element regions 31S are formed using Si, for example.

A plurality of wirings 35W and a plurality of vias 35V are disposed within the multilayer wiring layer 35. A plurality of pads 35P are disposed in an uppermost layer of the multilayer wiring layer 35. A bump 40 is disposed on each of the pads 35P.

The support substrate 50 is formed of a semiconductor such as silicon. An opening 50B is provided in the support substrate 50. The opening 50B extends to the insulating layer 20 from the bottom surface of the support substrate 50, which is the surface on the opposite side from the side where the insulating layer 20 is disposed. The opening 50B overlaps the semiconductor element regions 31S when the device layer 30 is viewed in plan view in the direction in which the device layer 30 and the insulating layer 20 are stacked (hereafter, simply "in plan view"). For example, the opening 50B encompasses the semiconductor element regions 31S in plan view. The opening 50B may overlap only parts of or some of the semiconductor element regions 31S in plan view.

The heat dissipation layer 60 fills the inside of the opening 50B. Specifically, the heat dissipation layer 60 contacts the insulating layer 20 in the region encompassed by the opening 50B in plan view, and the heat dissipation layer 60 contacts the entirety of the side surface of the opening 50B. For example, a filler-containing resin, a ceramic, and so on is used for the heat dissipation layer 60. The thermal conductivity of the heat dissipation layer 60 is higher than the thermal conductivity of the insulating layer 20.

Figure 2:
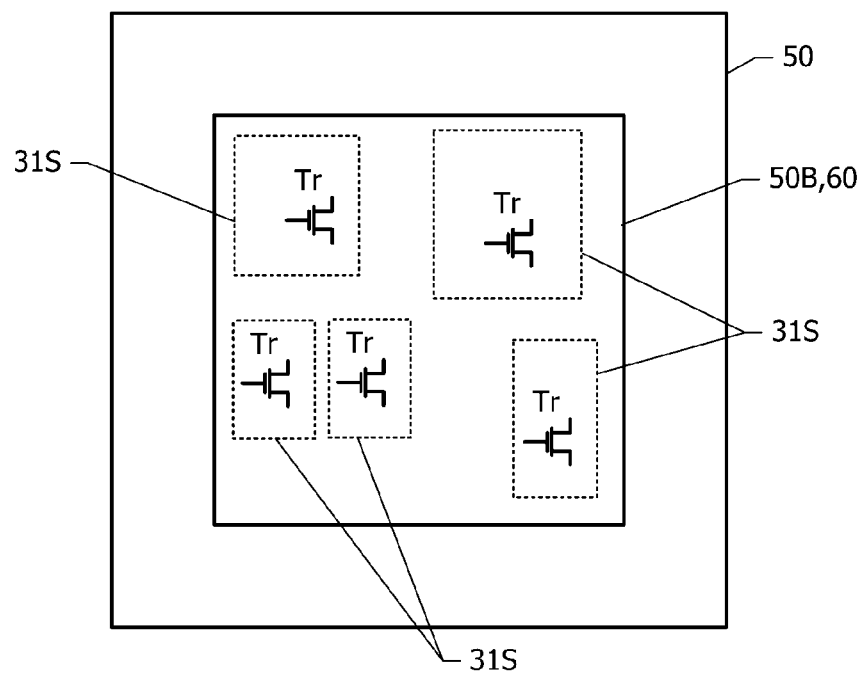
FIG. 2 is a sectional view of the semiconductor device according to the First Embodiment.

FIG. 2 is a bottom view of the semiconductor device according to the First Embodiment. The heat dissipation layer 60 is disposed inside the annular-shaped support substrate 50. The heat dissipation layer 60 encompasses the plurality of semiconductor element regions 31S in plan view. A semiconductor element such as a MOS transistor Tr is disposed in each of the semiconductor element regions 31S.

Figure 3:
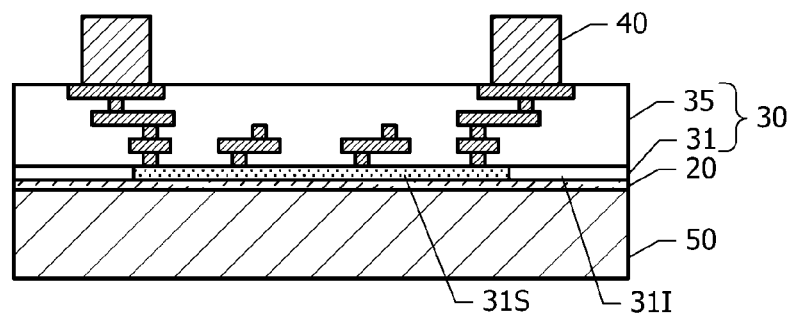
FIG. 3 is a (first) sectional view of the semiconductor device according to the First Embodiment at a point during the manufacture of the semiconductor device.
Figure 4:
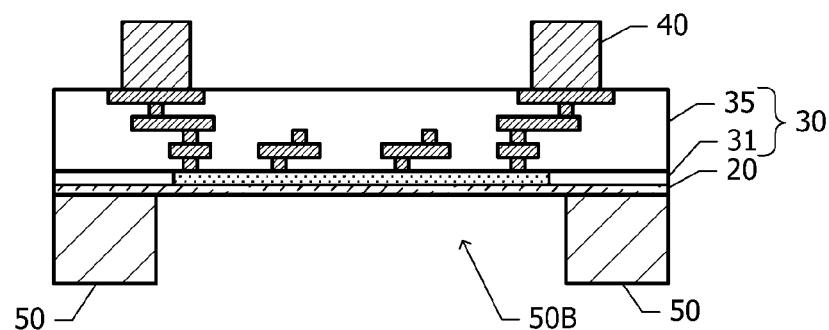
FIG. 4 is a (second) sectional view of the semiconductor device according to the First Embodiment at a point during the manufacture of the semiconductor device.
Figure 5:
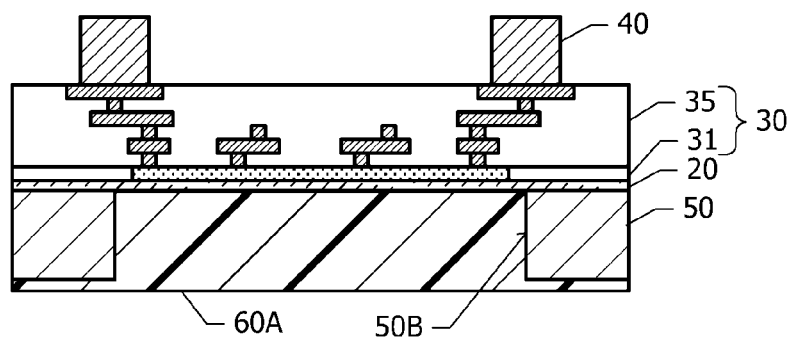
FIG. 5 is a (third) sectional view of the semiconductor device according to the First Embodiment at a point during the manufacture of the semiconductor device.

Next, a method for manufacturing the semiconductor device according to the First Embodiment will be described while referring to FIGS. 3, 4, and 5. FIGS. 3, 4, and 5 are sectional views of the semiconductor device according to the First Embodiment at points during the manufacture of the semiconductor device.

As illustrated in FIG. 3, an SOI substrate composed of the support substrate 50, the insulating layer 20, and the element formation layer 31 is prepared. The element isolation region 31I is formed in the element formation layer 31, and semiconductor elements such as transistors are formed in the semiconductor element regions 31S surrounded by the element isolation region 31I. The multilayer wiring layer 35 is formed on the element formation layer 31. In the steps up to this point, the device layer 30 including the element formation layer 31 and the multilayer wiring layer 35 is formed. In addition, a plurality of bumps 40 are formed. In the steps up to this point, known semiconductor processes can be used.

As illustrated in FIG. 4, the opening 50B is formed in the support substrate 50. The opening 50B can be formed, for example, by forming a mask pattern on the bottom surface of the support substrate 50 using photolithography and then etching the support substrate 50 using this mask pattern as an etching mask. The insulating layer 20 is exposed at the bottom of the opening 50B.

As illustrated in FIG. 5, a resin layer 60A is formed by applying a photosensitive polymer containing filler to the bottom surface of the support substrate 50 and to the sides and bottom of the opening 50B. The part of the resin layer 60A formed on the bottom surface of the support substrate 50 is then removed by being exposed to light and developed. The heights of the bottom surface of the support substrate 50 and the surface of the resin layer 60A are then made to match each other by grinding down the surface of the resin layer 60A remaining in the opening 50B. The resin layer 60A remaining in the opening 50B constitutes the heat dissipation layer 60 (FIG. 1). After that, the support substrate 50 is divided into individual chips by cutting the support substrate 50 with a dicing machine. If the surface of the heat dissipation layer 60 protrudes from the bottom of the support substrate 50 without causing any problems when performing mounting, there is no need to grind down the part of the resin layer 60A protruding from the bottom surface of the support substrate 50.

Figure 6:
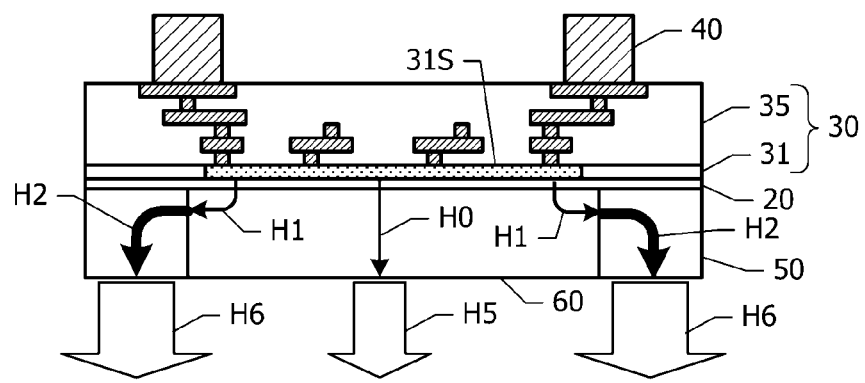
FIG. 6 is a sectional view schematically illustrating heat dissipation paths in the semiconductor device according to the First Embodiment.
Figure 7:
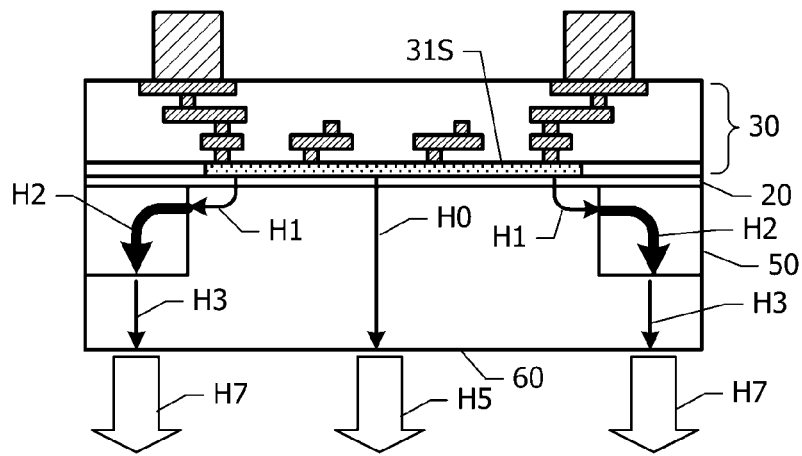
FIG. 7 is a sectional view schematically illustrating heat dissipation paths in a semiconductor device according to a comparative example.

Next, advantageous effects of the First Embodiment will be described while referring to FIGS. 6 and 7. FIGS. 6 and 7 are sectional views schematically illustrating heat dissipation paths in semiconductor devices according to the First Embodiment and a comparative example. In the semiconductor device according to the First Embodiment (FIG. 6), the bottom surface of the support substrate 50 is exposed and is not covered by the heat dissipation layer 60, whereas in the semiconductor device according to the comparative example (FIG. 7), the entire bottom surface of the support substrate 50 is covered by the heat dissipation layer 60.

When the semiconductor devices are made to operate, heat is mainly generated in the semiconductor element regions 31S. Heat generated in the semiconductor element regions 31S is conducted to the heat dissipation layer 60 through the insulating layer 20. Part of the heat conducted up to the heat dissipation layer 60 is conducted in the thickness direction within the heat dissipation layer 60, as indicated by an arrow H0, and then radiated outward from the bottom surface of the heat dissipation layer 60, as indicated by a hollow arrow H5. In addition, the other part of the heat conducted up to the heat dissipation layer 60 is conducted in in-plane directions within the heat dissipation layer 60 so as to reach the support substrate 50, as indicated by arrows H1. Since the heat dissipation layer 60 is relatively thick compared to the device layer 30 and the insulating layer 20, and the thermal conductivity of the heat dissipation layer 60 is higher than the thermal conductivity of the insulating layer 20, disposing the heat dissipation layer 60 allows the heat generated in the semiconductor element regions 31S to easily diffuse in the in-plane directions. The heat conducted up to the support substrate 50 is conducted in the thickness direction within the support substrate 50 as indicated by arrows H2.

In the semiconductor device according to the First Embodiment illustrated in FIG. 6, the heat conducted through the support substrate 50 in the thickness direction radiates to the outside from the bottom surface of the support substrate 50 as indicated by hollow arrows H6. In contrast, in the semiconductor device according to the comparative example illustrated in FIG. 7, since the entire bottom surface of the support substrate 50 is covered by the heat dissipation layer 60, heat that has reached the bottom surface of the support substrate 50 is conducted once again within the heat dissipation layer 60, is conducted through the heat dissipation layer 60 in the thickness direction as indicated by arrows H3, and is then radiated to the outside from the bottom surface of the heat dissipation layer 60 as indicated by arrows H7.

Thus, in the comparative example (FIG. 7), there are extra heat conduction paths indicated by arrows H3 compared to the First Embodiment (FIG. 6). Since the thermal conductivity of the heat dissipation layer 60 is lower than that of the support substrate 50, the heat dissipation efficiency of the semiconductor device according to the comparative example is reduced. In the First Embodiment, heat is radiated directly from the bottom surface of the support substrate 50, and therefore the heat dissipation efficiency is higher than in the comparative example.

In the First Embodiment, the part of the support substrate 50 in the area overlapping the semiconductor element regions 31S in plan view is removed in order to form the opening 50B. Therefore, parasitic capacitances between the semiconductor element regions 31S and the support substrate 50 can be reduced. Since the heat dissipation layer 60 filling the opening 50B has an insulating property, the parasitic capacitances generated in the semiconductor element regions 31S do not increase. Thus, degradation of radio-frequency characteristics of the semiconductor device is suppressed.

Figure 8:
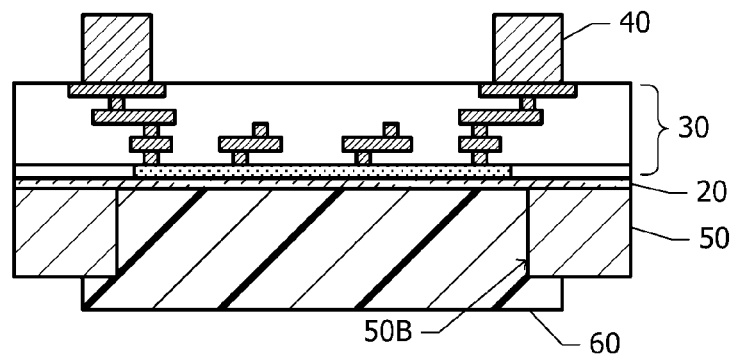
FIG. 8 is a sectional view of a semiconductor device according to a modification of the First Embodiment.
Figure 9:
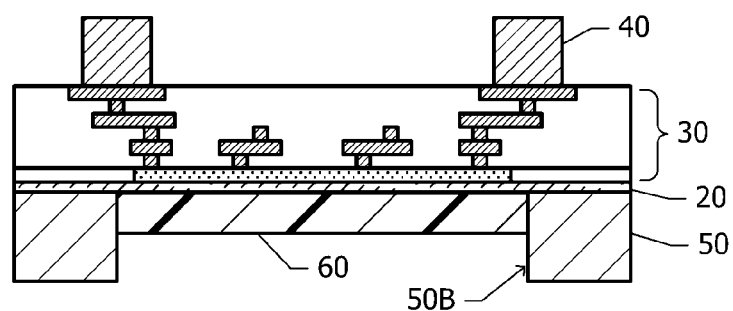
FIG. 9 is a sectional view of a semiconductor device according to another modification of the First Embodiment.

Next, a semiconductor device according to a modification of the First Embodiment will be described while referring to FIGS. 8 and 9. FIGS. 8 and 9 are sectional views of a semiconductor device according to a modification of the First Embodiment.

In the semiconductor device according to the First Embodiment (FIG. 1), the heat dissipation layer 60 fills the inside of the opening 50B and does not extend onto the bottom surface of the support substrate 50. In other words, the entire bottom surface of the support substrate 50 is exposed. In contrast, in the semiconductor device according to this modification illustrated in FIG. 8, the heat dissipation layer 60 extends across a region of the bottom surface of the support substrate 50 located around the periphery of the opening 50B. The rest of the bottom surface of the support substrate 50 is exposed. Heat conducted to the support substrate 50 radiates to the outside from the exposed bottom surface of the support substrate 50.

The semiconductor device according to the modification illustrated in FIG. 8 can be manufactured by exposing the resin layer 60A composed of a photosensitive polymer illustrated in FIG. 5 to light so that the resin layer 60A remains in a region slightly outside the edge of the opening 50B.

In the semiconductor device according to the First Embodiment (FIG. 1), the surface of the heat dissipation layer 60 is located at substantially the same height as the bottom surface of the support substrate 50, and the heat dissipation layer 60 is in contact with the entire side surface of the opening 50B. In contrast, in the modification illustrated in FIG. 9, the thickness of the heat dissipation layer 60 is less than the thickness of the support substrate 50. In other words, part of the side surface of the opening 50B located on the side near the bottom surface of the support substrate 50 is exposed. In this modification, the heat conducted to the support substrate 50 is also radiated from the exposed side surface of the opening 50B.

The semiconductor device according to the modification illustrated in FIG. 9 can be manufactured by etching away the resin layer 60A from the entire bottom surface of the resin layer 60A illustrated in FIG. 5 until the bottom surface of the support substrate 50 is exposed, and then etching away a portion of the resin layer 60A filling the opening 50B. In this modification, since it is not necessary to expose and develop the resin layer 60A, a polymer that is not a photosensitive polymer can be used. Furthermore, a layer composed of an inorganic insulating material can be used instead of the resin layer 60A. For example, a ceramic can be used. A layer composed of a ceramic can be deposited for example by performing chemical vapor deposition (CVD), sputtering, and so on.

Next, another modification of the First Embodiment will be described. In the First Embodiment (FIG. 2), a plurality of semiconductor element regions 31S are encompassed by a single opening 50B in plan view, but an opening 50B may instead be provided for each semiconductor element region 31S. Another configuration may be adopted in which a plurality of openings 50B are provided and a number of the semiconductor element regions 31S are encompassed by each of the openings 50B.

Second Embodiment

Next, a semiconductor device according to a Second Embodiment will be described while referring to FIGS. 10 to 18. Hereafter, description of parts of the configuration that are the same as in the semiconductor device according to the First Embodiment described while referring to the drawings in FIGS. 1 to 6 will be omitted.

Figure 10:
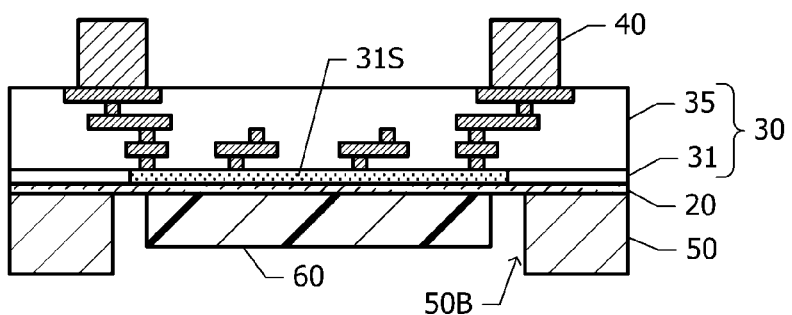
FIG. 10 is a sectional view of a semiconductor device according to a Second Embodiment.

FIG. 10 is a sectional view of the semiconductor device according to the Second Embodiment. In the semiconductor device according to the First Embodiment (FIG. 1), the entirety of the surface of the insulating layer 20 inside the opening 50B is covered by the heat dissipation layer 60, and the heat dissipation layer 60 is in contact with the side surface of the opening 50B. In contrast, in the semiconductor device according to the Second Embodiment, the heat dissipation layer 60 is disposed so as to be spaced apart from the side surface of the opening 50B. Therefore, the entire side surface of the opening 50B is exposed.

Figure 11:
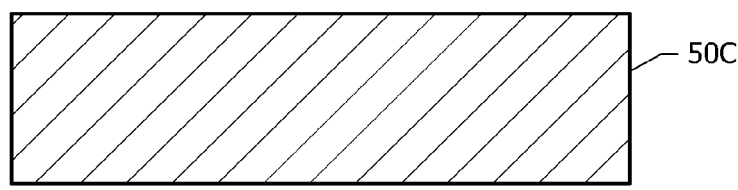
FIG. 11 is a (first) sectional view of the semiconductor device according to the Second Embodiment at a point during the manufacture of the semiconductor device.
Figure 12:
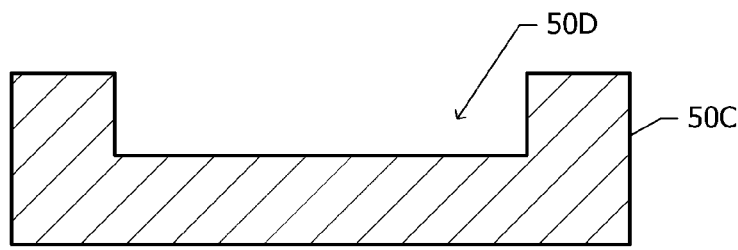
FIG. 12 is a (second) sectional view of the semiconductor device according to the Second Embodiment at a point during the manufacture of the semiconductor device.

Next, a method for manufacturing the semiconductor device according to the Second Embodiment will be described while referring to FIGS. 11 to 18. FIGS. 11 to 18 are sectional views of the semiconductor device according to the Second Embodiment at points during the manufacture of the semiconductor device. As illustrated in FIG. 11, a semiconductor substrate that will become the support substrate 50 (FIG. 10), for example, a substrate 50C composed of Si is prepared. As illustrated in FIG. 12, a recess 50D is formed in one surface of the substrate 50C. The recess 50D is formed in a region where the opening 50B (FIG. 10) is to be disposed.

Figure 13:
FIG. 13 is a (third) sectional view of the semiconductor device according to the Second Embodiment at a point during the manufacture of the semiconductor device.
Figure 14:
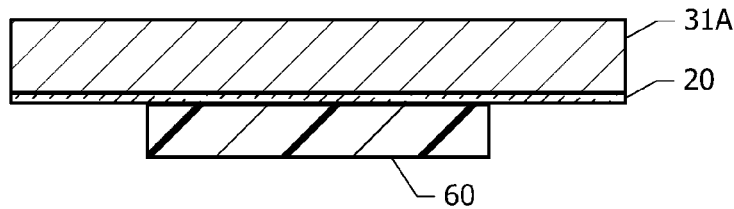
FIG. 14 is a (fourth) sectional view of the semiconductor device according to the Second Embodiment at a point during the manufacture of the semiconductor device.

As illustrated in FIG. 13, the insulating layer 20 composed of silicon oxide is formed on one surface of an original substrate 31A composed of Si, which will become the element formation layer 31 (FIG. 10). The insulating layer 20 may be formed using thermal oxidation or another method. As illustrated in FIG. 14, the heat dissipation layer 60 is formed on the surface of the insulating layer 20. The heat dissipation layer 60 can be formed, for example, by applying a photosensitive polymer, and then subjecting the polymer to light exposure and development.

Figure 15:
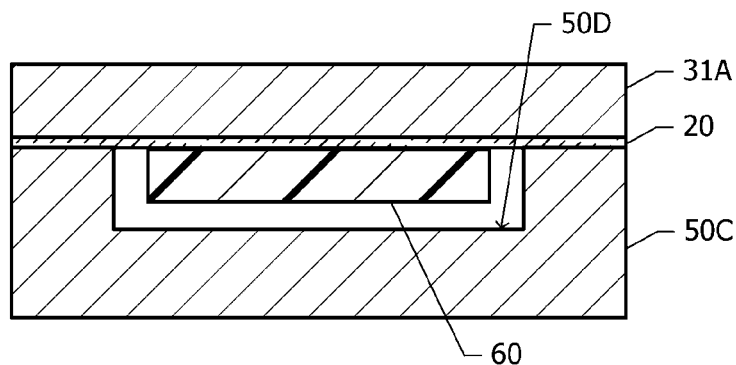
FIG. 15 is a (fifth) sectional view of the semiconductor device according to the Second Embodiment at a point during the manufacture of the semiconductor device.

As illustrated in FIG. 15, the surface of the substrate 50C in which the recess 50D has been formed is made to face the insulating layer 20 and the substrate 50C is bonded to the insulating layer 20. At this time, the insulating layer 20 and the substrate 50C are positioned so that the heat dissipation layer 60 is accommodated inside the recess 50D. In the steps up to this point, a cavity SOI substrate consisting of the original substrate 31A, the insulating layer 20, and the substrate 50C and having a cavity thereinside is manufactured. The heat dissipation layer 60 is accommodated inside the cavity.

Figure 16:
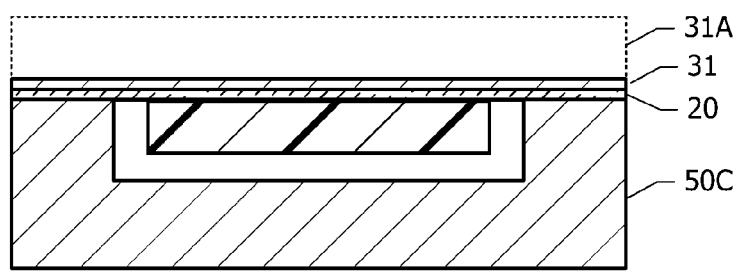
FIG. 16 is a (sixth) sectional view of the semiconductor device according to the Second Embodiment at a point during the manufacture of the semiconductor device.
Figure 17:
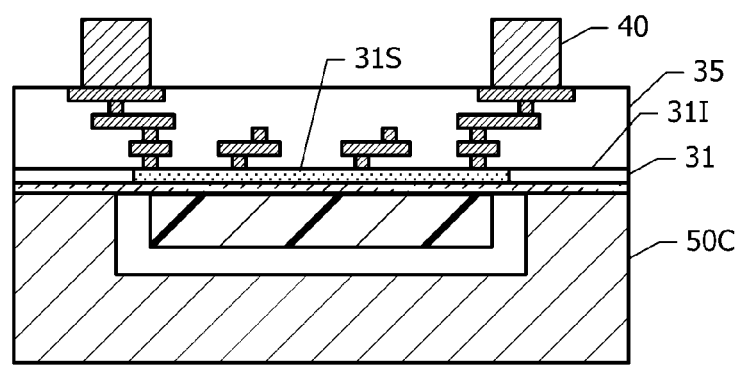
FIG. 17 is a (seventh) sectional view of the semiconductor device according to the Second Embodiment at a point during the manufacture of the semiconductor device.

As illustrated in FIG. 16, the original substrate 31A is ground down or polished to a thin layer, and the element formation layer 31 composed of part of the original substrate 31A remains. As illustrated in FIG. 17, the element isolation region 31I is formed in the element formation layer 31 so as to define the semiconductor element regions 31S, and semiconductor elements such as MOS transistors are formed in the semiconductor element regions 31S. The multilayer wiring layer 35 and the plurality of bumps 40 are formed on the element formation layer 31.

Figure 18:
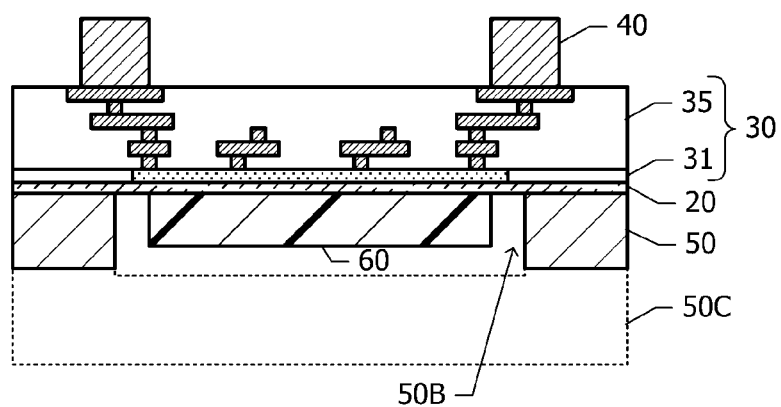
FIG. 18 is a (eighth) sectional view of the semiconductor device according to the Second Embodiment at a point during the manufacture of the semiconductor device.

As illustrated in FIG. 18, the substrate 50C is ground down until the cavity is reached, thereby leaving the support substrate 50 composed of part of the substrate 50C. The part that is the cavity corresponds to the opening 50B. Thus, the heat dissipation layer 60 is exposed. After that, the support substrate 50 is divided into individual chips by cutting the support substrate 50 with a dicing machine.

Next, advantageous effects of the Second Embodiment will be described.

In the Second Embodiment, among the semiconductor element regions 31S, heat generated in the semiconductor element regions 31S overlapping the heat dissipation layer 60 in plan view is radiated to the outside via the insulating layer 20 and the heat dissipation layer 60. The heat generated in the semiconductor element regions 31S in the vicinity of the support substrate 50 is conducted through the device layer 30 and the insulating layer 20 to the support substrate 50. The heat dissipation layer 60 functions as a heat path allowing heat generated in the semiconductor element regions 31S to diffuse in in-plane directions, and therefore the heat generated near the centers of the semiconductor element regions 31S is also easily conducted to the support substrate 50. The heat conducted to the support substrate 50 is radiated to the outside from the bottom surface of the support substrate 50 and the side surface of the opening 50B.

Since the bottom surface of the support substrate 50 and the side surface of the opening 50B, which have a relatively high thermal conductivity, are exposed to the outside, the efficiency of heat dissipation from the semiconductor element regions 31S is higher than in a configuration where the side surface of the opening 50B is covered by the heat dissipation layer 60, which has a relatively low thermal conductivity.

Each of the above-described embodiments is an illustrative example and it goes without saying that parts of the configurations illustrated in different embodiments can be substituted for one another or combined with each other. The same operational effects resulting from the same configurations in a plurality of embodiments are not repeatedly described in the individual embodiments. In addition, the present disclosure is not limited to the above-described embodiments. For example, it will be clear to a person skilled in the art that various changes, improvements and combinations thereof are possible.

The following disclosures are disclosed based on the above embodiments described in the present specification.

<1> A semiconductor device comprising a device layer including a semiconductor element in part of a region thereof; an insulating layer disposed on one surface of the device layer; and a support substrate composed of a semiconductor and disposed on a surface of the insulating layer located on an opposite side from a side where the device layer is disposed. An opening is provided in the support substrate, the opening overlapping a semiconductor element region in which the semiconductor element is formed in plan view, and the opening extending from a bottom surface of the support substrate to the insulating layer, the bottom surface being located on an opposite side from a side where the insulating layer is disposed. The semiconductor device further comprises a heat dissipation layer that contacts the insulating layer in a region encompassed by the opening in plan view and has a thermal conductivity higher than a thermal conductivity of the insulating layer, and at least part of a region consisting of the bottom surface of the support substrate and a side surface of the opening is not covered by the heat dissipation layer.

<2> The semiconductor device according to <1>, wherein the support substrate contains Si.

<3> The semiconductor device according to <1> or <2>, wherein the heat dissipation layer is formed of a resin containing filler.

<4> The semiconductor device according to any one of <1> to <3>, wherein the semiconductor element region is encompassed by the opening in plan view.

<5> The semiconductor device according to any one of <1> to <4>, wherein no part of the bottom surface of the support substrate is covered by the heat dissipation layer.

<6> The semiconductor device according to <5>, wherein at least part of a region of the side surface of the opening located on a side near the bottom surface is not covered by the heat dissipation layer.

<7> The semiconductor device according to <5>, wherein the heat dissipation layer is disposed so as to be spaced apart from the side surface of the opening.

What is claimed is:

1. A semiconductor device comprising:
    a device layer including a semiconductor element in part of a region thereof;
    an insulating layer on one surface of the device layer;
    a support substrate including a semiconductor and disposed on a surface of the insulating layer located on an opposite side from a side where the device layer is disposed, the support substrate including an opening therein, the opening overlapping a semiconductor element region in which the semiconductor element is configured in plan view, and the opening extending from a bottom surface of the support substrate to the insulating layer, the bottom surface being on an opposite side from a side where the insulating layer is disposed; and
    a heat dissipation layer that contacts the insulating layer in a region encompassed by the opening in plan view and has a thermal conductivity higher than a thermal conductivity of the insulating layer, and
    at least part of a region including the bottom surface of the support substrate and a side surface of the opening is not covered by the heat dissipation layer.

2. The semiconductor device according to claim 1, wherein the support substrate includes Si.

3. The semiconductor device according to claim 1, wherein
    the heat dissipation layer includes a resin including filler.

4. The semiconductor device according to claim 1, wherein
    the semiconductor element region is encompassed by the opening in plan view.

5. The semiconductor device according to claim 1, wherein
    no part of the bottom surface of the support substrate is covered by the heat dissipation layer.

6. The semiconductor device according to claim 5, wherein
    at least part of a region of the side surface of the opening located on a side near the bottom surface is not covered by the heat dissipation layer.

7. The semiconductor device according to claim 5, wherein
    the heat dissipation layer is spaced apart from the side surface of the opening.

8. The semiconductor device according to claim 2, wherein
    the heat dissipation layer includes a resin including filler.

9. The semiconductor device according to claim 2, wherein
    the semiconductor element region is encompassed by the opening in plan view.

10. The semiconductor device according to claim 2, wherein
    no part of the bottom surface of the support substrate is covered by the heat dissipation layer.

\* \* \* \* \*